United States Patent [19]
Jiang et al.

[11] Patent Number: 6,091,754
[45] Date of Patent: Jul. 18, 2000

[54] VCSEL HAVING INTEGRATED PHOTODETECTOR FOR AUTOMATIC POWER CONTROL

[75] Inventors: Wenbin Jiang, Phoenix; Michael S. Lebby, Apache Junction, both of Ariz.

[73] Assignee: Motorola, Inc., Schaumburg, Ill.

[21] Appl. No.: 09/066,658

[22] Filed: Apr. 27, 1998

[51] Int. Cl.$^7$ ...................................................... H01S 3/19
[52] U.S. Cl. .................. 372/50; 372/46; 372/96
[58] Field of Search .................................. 372/43, 45, 46, 372/50, 96

[56] References Cited

U.S. PATENT DOCUMENTS

| | | | |
|---|---|---|---|
| 5,606,572 | 2/1997 | Swirhun et al. | 372/96 |
| 5,742,630 | 4/1998 | Jiang et al. | 372/50 |
| 5,751,757 | 5/1998 | Jiang et al. | 372/50 |
| 5,838,708 | 11/1998 | Lin et al. | 372/50 |

*Primary Examiner*—Hemang Sanghavi
*Attorney, Agent, or Firm*—Eugene A. Parsons

[57] ABSTRACT

A VCSEL (113) having a first and a second stack of distributed Bragg reflectors (120, 116) and an active region (118) is formed. Conductive layers (108 and 109) having an opening is formed on the second stack of distributed Bragg reflectors (116). A first region (104), a second region (106), and a third region (108) are formed in the opening of the conductive layer (108), thereby providing a contact to both the second stack of distributed Bragg reflectors (116) and to the first region (104). An insulative layer (220) is disposed on the substrate (124), thereby insulating the second region (106) from the conductive layer (108). A conductive layer (134) having second opening disposed substantially overlying the first opening, thereby electrically coupling the third region (108) to the conductive layer (134) with the second opening allowing a light (121) to pass.

16 Claims, 1 Drawing Sheet

VCSEL HAVING INTEGRATED PHOTODETECTOR FOR AUTOMATIC POWER CONTROL

FIELD OF THE INVENTION

This invention relates, in general, to optical devices and more particularly, to light emitting devices and photodetectors.

BACKGROUND OF THE INVENTION

Automatic power control (APC) of light emitting devices allows for a constant and a consistent output from these devices. Generally, automatic power control of edge emitting laser devices is easily achieved because edge emitting devices emit light from two ends. Thus, enabling one of the light emitting ends to be used to measure the power output, which is subsequently used to adjust the power input to the edge emitting device, thereby adjusting the power output of the edge emitting device.

However, automatic power control of a vertical cavity surface emitting laser (VCSEL) is a difficult task because the VCSEL generally emits light from only a single surface, thus making measurement of the output and subsequent adjustment thereof a difficult task. Conventionally, in order to accomplish this task, several optical devices, such as photodiodes, mirrors, beam splitters, and the like are positioned manually in the optical path of the emission from the VCSEL. With the optical devices being positioned manually, several problems or disadvantages result, such as a high cost of manufacture, a lack of repeatability, and poor quality control, and the like, thus prohibiting high volume manufacturing.

It can be readily seen that conventional APC of VCSELs has several disadvantages and problems, thus hindering their manufacture in volume manufacturing applications. Therefore, an integrated article and method for making same that simplifies the fabrication process, reduces cost, and improves reliability would be highly desirable.

It is a purpose of the present invention to provide a new and improved VCSEL with an integrated photodetector for automatic power control.

It is another purpose of the present invention to provide a new and improved VCSEL with an integrated photodetector for automatic power control which is cost effective and has improved efficiency.

SUMMARY OF THE INVENTION

The above problems and others are at least partially solved and the above purposes and others are realized in

BRIEF DESCRIPTION OF THE DRAWINGS

Referring to the drawings.

DESCRIPTION OF THE PREFERRED EMBODIMENTS

Figure 1:
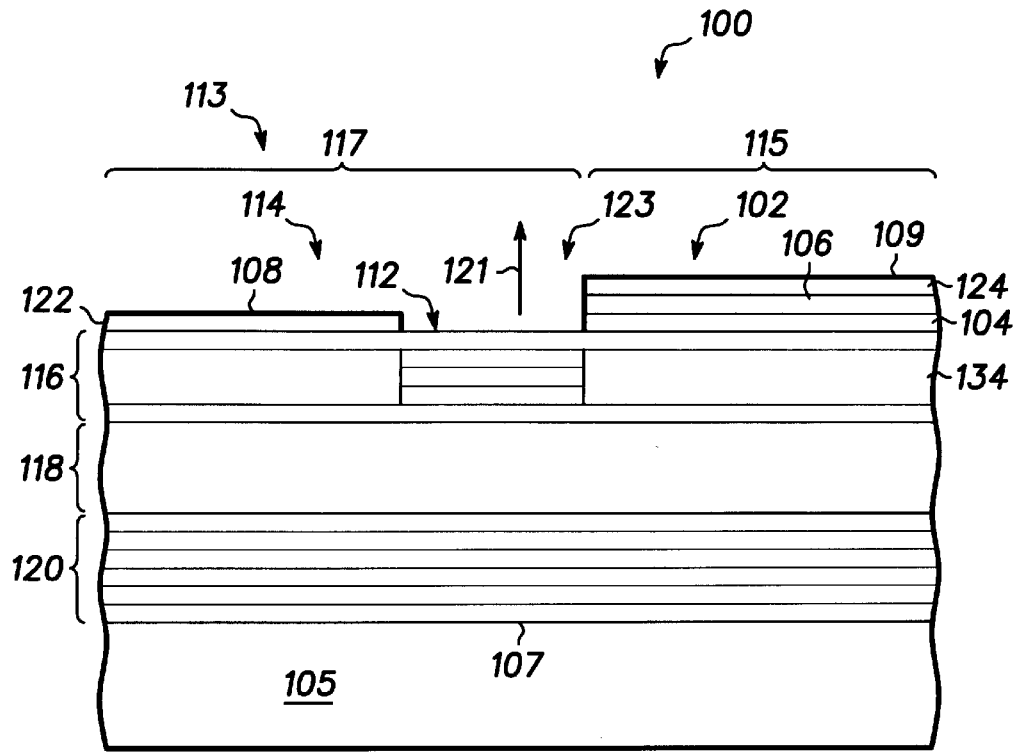
FIG. 1 is a simplified sectional view of a planar VCSEL with a p-i-n photodiode.
Figure 2:
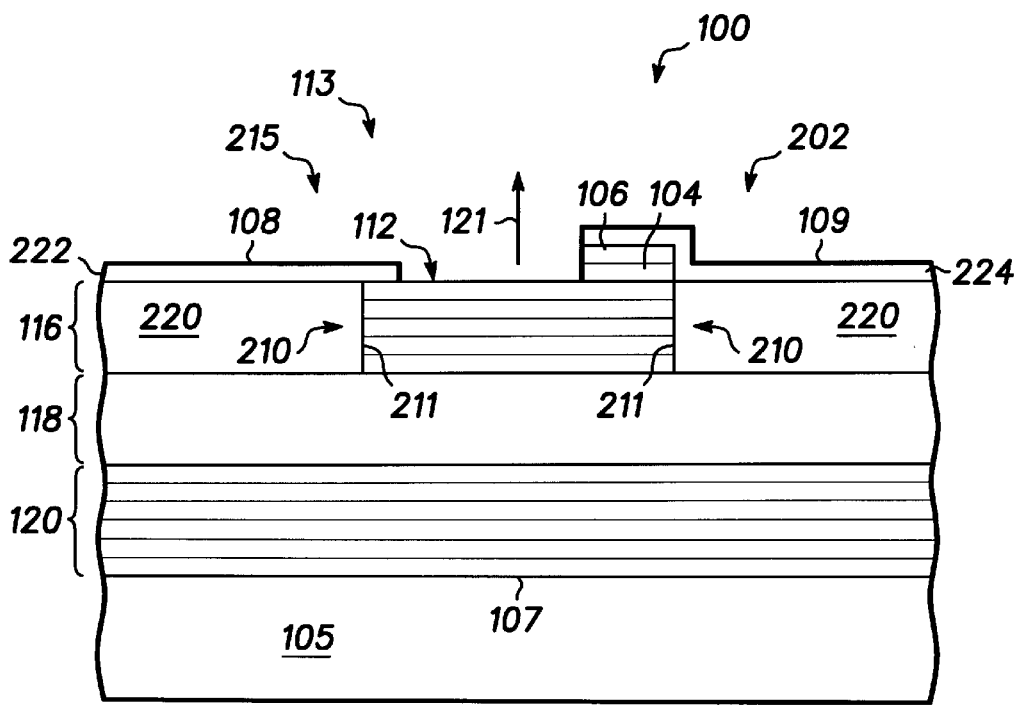
FIG. 2 is a simplified sectional view of a ridge VCSEL with a p-i-n photodiode.

FIGS. 1 and 2 illustrate an integrated device 100 that includes a photodetector 102 for measuring emitted light 121 from a VCSEL 113. However, it should be noted that in FIG. 1 VCSEL 113 is represented by a planar VCSEL 114 and in FIG. 2 VCSEL 113 is represented by a ridge VCSEL 215. Photodetector 102 can be any suitable photodetector, such as a p-i-n photodetector or the like. Photodetector 102 includes a material layer 104, a material layer 106, and a conductive layer 108. As shown in FIGS. 1 and 2, planar VCSEL 114 and ridge VCSEL 215 include a substrate 105 having a surface 107, a stack of distributed Bragg reflectors 120 (DBR), an active area 118, a stack of distributed Bragg reflectors 116, a surface 112, a conductive layer 108, and a conductive layer 109. As illustrated in FIG. 2, ridge VCSEL 215 is shown to include a ridge 210 having sidewalls 211 and an insulative layer 220, whereas FIG. 1 shows that planar VCSEL 114 includes a damaged region 134.

It should be understood that FIGS. 1 and 2 are simplified illustrations and that many elements have been purposely omitted to more clearly illustrate the present invention. Further, it should be noted that FIGS. 1 and 2 are sectional views, thereby enabling the integrated device 100 to extend into an out of the figure. Thus, integrated device 100 can incorporate a single device or an array of integrated devices.

Generally, as shown in FIGS. 1 and 2, both planar VCSEL 114 and ridge VCSEL 215 are made by any well-known method or combination of methods in the art. However, for the purposes of orienting the reader, a brief description of materials and methods is provided hereinbelow. Briefly, planar VCSEL 114 and ridge VCSEL 215 are fabricated on any suitable substrate, such as a semiconductor substrate, e.g., gallium arsenide, indium phosphite, or the like where the substrate provides surface 107. The stack of distributed Bragg reflectors 120, active area 118, the stack of distributed Bragg reflectors 116 are sequentially epitaxially deposited on surface 107 by any suitable method or combination of methods, such as molecular beam epitaxy (MBE), metoorganic chemical vapor deposition (MOCVD), or the like. In the present invention, the stacks of distributed Bragg reflectors 116 and 120 are alternatively doped with different dopant types, i.e., n-type or p-type dopants. By way of example, the stack of distributed Bragg reflectors 120 is doped with any suitable n-type dopant, such as silicon, selenium, or the like, while the stack of distributed Bragg reflectors 116 is doped with any suitable p-type dopant, such as carbon, zinc, or the like.

Referring now to FIG. 1, once the epitaxial depositions are complete, an ion implant mask (not shown) is formed on the stack of distributed Bragg reflectors 116. The ion implant mask is fabricated by any suitable well-known method in the art such as photolithography, deposition, etching, or any combination thereof. The ion implant mask provides openings which expose portions of the stack of distributed Bragg reflectors 116 while covering or protecting other portions of the stack of distributed Bragg reflectors 116. Typically, the ion implant mask is shaped in a dot pattern, i.e., islands of the ion implant mask are placed on the stack of distributed Bragg reflectors 116. Once the ion implant mask is formed, the stack of Bragg reflectors 116 is ion implanted by any suitable well-known method in the art, thereby generating damaged region 134.

Generally, ion implantation injects ions through the exposed surface of the stack of distributed Bragg reflectors 116, while the ion implant mask protects and does not allow the ions to penetrate into the surface of the stack of distributed Bragg reflectors 116. When the ions pass through the surface of the stack of distributed Bragg reflectors 116 and come to rest in the stack of distributed Bragg reflectors 116, they cause damage in the crystal lattice structure resulting in damaged region 134. Because damaged region 134 does not conduct as readily as where there is no damage, a current pathway is defined in an area where there is no damage, thus providing the current pathway that is determined and confined for planar VCSEL 114.

Material layers 104 and 106 can be made of any suitable material or combination of materials, such as gallium arsenide, aluminum gallium arsenide, or the like, that are grown by either MOCVD or MBE with the rest of the VCSEL layers. Material layers 104 and 106 can be made to have any suitable thickness. Typically, material layers 104 and 106 have a thickness that can range from 0.01 to 3 μm, with a preferred thickness ranging from 0.1 to 2 μm, and with a nominal thickness ranging from 0.5 to 1.5 μm.

While material layer 104 is undoped, material layer 106 is doped with any suitable n-type dopant as described previously. Doping concentrations of n-type dopant for material layer 106 can range from 1e16 to 1e20 $cm^{-3}$, with preferred range from 1e17 to 1e19 $cm^{-3}$, and a nominal range from 1e18 to 5e18 $cm^{-3}$. By positioning the stack of distributed Bragg reflectors 116, material layer 104, and material layer 106, a p-i-n structure, i.e., a p-type doped area, an undoped or intrinsic area, and an n-type doped area is formed, thus forming photodetector 102 having a p-i-n structure.

Once the ion implantation of the stack of distributed Bragg reflectors 116 is complete, a conductive layer 109 is deposited onto the layer 106 by metal lift-off technique to define the first electrical contact for a p-i-n photodiode. The preferred metal for conductive layer 109 is AuGe/Au alloy.

The material layers 104 and 106 on the stack of distributed Bragg reflectors 116 that are not covered by metal contact 109, specified by region 117, are sequentially removed by any suitable etching method or combination of methods, such as dry plasma etch, e.g., a chlorine plasma, or a wet chemical etch, e.g., $H_2SO_4:H_2O_2:H_2O$ solution. The region 115 is protected by metal contact 109 during the etching. After removal of the exposed portion of material layers 104 and 106 in region 117, a portion of surface 112 is exposed while another portion of surface 112 is covered by material layers 104 and 106 and metal contact 109. Thus, by positioning material layers 104 and 106 on the stack of distributed Bragg reflectors 116 and subsequently etching a portion of material layers 104 and 106 away, a p-i-n junction is formed, represented by photodetector 102, that is sensitive to the tail of emitted light 121 as light 121 passes by.

Conductive layer 108 is then disposed on a portion of the exposed surface 112 on top of the damaged region 134 so as to define a light emission opening 123, by any suitable method or methods, such as sputtering, evaporation, or the like, using lift-off technique to define a common electrical contact that is shared by both the VCSEL 113 and the photodiode 102. Conductive layer 108 is made of any suitable conductive material, such as a metal, e.g., gold, silver, or the like, or an alloy, such as aluminum/copper/silicon, or the like. The preferred metal contact for 108 is ZnAu/Au or TiAu/Au alloy. Thus, planar VCSEL 114 is electrically coupled by substrate 105 and electrical contact 108, whereas photodetector 102 is electrically coupled by the electrical contact 108 through the stack of distributed Bragg reflectors 116 and electrical contact 109. The metal contacts 108 and 109 also define VCSEL light emission path 123.

Referring now to FIG. 2, in the present invention, after the epitaxial depositions of the stack of distributed Bragg reflectors 120, active area 118, and the stack of distributed Bragg reflectors 116 are completed, the stack of distributed Bragg reflectors 116 is patterned to form ridge 210. Generally, ridge 210 is made by any suitable well-known method in the art, such as photolithography, etching, lift-off, any combination thereof, or the like. By defining ridge 210 in the stack of distributed Bragg reflectors 116, an optical path as well as a current path is defined in the stack of distributed Bragg reflectors 116 that reflects and guides light that is formed in active region or area 118.

Once ridge VCSEL 215 has been formed, a disposition or a series of depositions or applications and patterning steps are performed to fabricate an insulative layer 220. Insulative layer 220 can be made of any suitable dielectric material, such as nitride, oxynitride, oxide, polymer, e.g., polyimide, or the like. Generally, the depositions or applications are performed by any suitable well-known method in the art such as chemical vapor deposition (CVD), plasma enhanced chemical vapor deposition (PECVD), sputtering, spinning, or the like. Once insulative layer 220 is disposed on and around ridge 210, insulative layer 220 typically needs to be planarized. Planarization is achieved by any suitable method or combination of methods, such as photolithography, lift-off, etching, or any combination thereof.

Once insulative layer 220 is planarized, a first metal contact 109 is deposited on the surface of 106 to define an electrical contact for a p-i-n photodiode using lift-off technique. Material layers 104 and 106 have the same material characteristics as previously described with reference to FIG. 1. A portion of material layer 106 that is not covered by metal contact 109 is etched until both the exposed portion of material layer 106 is removed as well as an underlying portion of material layer 104. Thus when the etching process is complete a portion of material layers 104 and 106 remain on surface 112 of ridge 210 underneath the metal contact 109, while other portions of material layers 104 and 106 are removed, thereby exposing a portion of surface 112 of ridge 210.

Once the etching process of material layers 104 and 106 is complete, a conductive layer 108 is disposed on surface 112, exposed portions insulative layer 220, and portions of material layers 104 and 106, using lift-off technique. Thus, ridge VCSEL 215 is electrically coupled by substrate 105 and electrical contact 108, whereas photodetector 202 is electrically coupled by the common contact 108 through the stack of distributed Bragg reflectors 116 and electrical contact 109.

Referring to FIGS. 1 and 2, functionally, since the stack of distributed Bragg reflectors 116 are p-typed doped, since the material layer 104 is undoped or intrinsic, and since material layer 106 is n-typed doped, photodetectors 102 and 202 are formed as a p-i-n type photodetector that is integrated into VCSEL 113. A portion of the upward light radiation 121 is blocked by metal contacts 108 and 109, so that photodetectors 102 and 202 only capture amounts of the blocked light 121 that are repeatable and consistent so as to reliably indicate the performance of VCSEL 113. By capturing some of the blocked light 121 with photodetectors 102 and 202, a relative output level or performance can be measured and converted to an electrical signal which correlates to the performance and strength of VCSEL 113. As performance declines the signal generated by photodiodes 102 and 202 declines, thus enabling other electrical parameters of VCSEL 113 such as current or voltage to be varied so as to make the relative output level of VCSEL 113 constant. An important advantage of such an integrated VCSEL auto-power control (APC) approach is that the photodiode does not attenuate the emitted VCSEL output power.

By now it should be appreciated that a novel article and method for making have been provided. Integrated VCSEL is now integrated with a photodiode, thereby enabling the light output of VCSEL to be easily monitored and subsequently adjusted to a desired level. Additionally, since integrated VCSEL is fabricated as one device, integrated VCSEL is highly manufacturable, thus reducing cost and allowing significant improvements in reliability and quality.

While we have shown and described specific embodiment of the present invention, further modification and improvement will occur to those skilled in the art. We desire it to be understood, therefore, that this invention is not limited to the particular forms shown and we intend in the appended claims to cover all modification that do not depart from the spirit and scope of this invention.

What is claimed is:

1. A VCSEL with integrated photodetector comprising:
   a vertical cavity surface emitting laser having a substrate with a first surface, a first stack of distributed Bragg reflectors disposed on the first surface of the substrate, an active area disposed on the first stack of distributed Bragg reflectors, a second stack of distributed Bragg reflectors disposed on the active area, the second stack of distributed Bragg reflectors having a first dopant type and a damaged area positioned in a portion of the second stack of distributed Bragg reflectors that defines a current pathway through the second stack of distributed Bragg reflectors, and an electrical contact positioned on at least a portion of the second stack so as to define a light emission opening with some emitted light being blocked by the electrical contact;
   a first material layer being undoped and disposed to receive a portion of the emitted light that is blocked by the electrical contact;
   a second material layer having a second dopant type disposed on the first material layer, wherein the first dopant type and the second dopant type are opposite; and
   first and second conductive layers comprising the electrical contact positioned so that the first conductive layer is electrically coupled to the second stack of distributed Bragg reflectors and the second conductive layer is electrically coupled to the second material layer.

2. A VCSEL with integrated photodetector as claimed in claim 1 wherein the first dopant type is a p-type.

3. A VCSEL with integrated photodetector as claimed in claim 1 wherein the second stack of distributed Bragg reflectors is made of aluminum gallium arsenide.

4. A VCSEL with integrated photodetector as claimed in claim 1 wherein the second dopant type is an n-type.

5. A VCSEL with integrated photodetector as claimed in claim 1 wherein the second material layer is made of aluminum gallium arsenide.

6. A VCSEL with integrated photodetector as claimed in claim 1 wherein first material layer is made of gallium arsenide.

7. A VCSEL with integrated photodetector comprising:
   a vertical cavity surface emitting laser having a substrate with a first surface, a first stack of distributed Bragg reflectors disposed on the first surface of the substrate, an active area disposed on the first stack of distributed Bragg reflectors, a second stack of distributed Bragg reflectors having a first dopant type and disposed on the active area, a ridge, and an optical pathway, and whereby the ridge is etched into a portion of the second stack of distributed Bragg reflectors, thereby defining the optical pathway through which light passes;
   an insulative layer disposed around the ridge so as to fill an area around the ridge and planarize the substrate;
   a first undoped material layer disposed on a portion of the optical pathway;
   a second material layer having a second doping type disposed on the first material layer, wherein the first dopant type and the second dopant type are opposite; and
   two conductive layers with the first conductive layer being electrically coupled to the second stack of distributed Bragg reflectors and the second conductive layer being electrically coupled to the second material layer.

8. A VCSEL with integrated photodetector as claimed in claim 7 wherein the first material layer is made of gallium arsenide.

9. A VCSEL with integrated photodetector as claimed in claim 7 wherein the second material layer is made of aluminum gallium arsenide.

10. A VCSEL with integrated photodetector as claimed in claim 7 wherein the second stack of distributed Bragg reflectors is doped with a p-type dopant.

11. A VCSEL with integrated photodetector as claimed in claim 9 wherein the second material layer is doped with an n-type dopant.

12. A method for making a VCSEL with photodetector comprising the steps of:
    forming a vertical cavity surface emitting laser having a substrate with a first surface;
    disposing a first stack of distributed Bragg reflectors on the first surface of the substrate;
    disposing an active area on the first stack of distributed Bragg reflectors;
    disposing a second stack of distributed Bragg reflectors on the active area, forming the second stack with a first dopant type and a damaged area positioned in a portion of the second stack of distributed Bragg reflectors that defines a current pathway;
    forming a first undoped material layer on a portion of an optical pathway;
    disposing a second material layer having a second doping type on the first material layer, wherein the first dopant type and the second dopant type are opposite; and
    forming two conductive layers with the first conductive layer being electrically coupled to the second stack of distributed Bragg reflectors and the second conductive layer being electrically coupled to the second material layer.

13. A method for making a VCSEL with photodetector as claimed in claim 12 where, in the step of forming the first material layer, the first material layer is deposited by a metal-organic chemical vapor deposition process.

14. A method for making a VCSEL with photodetector as claimed in claim 13 where, in the step of forming the second material layer, the second material layer is deposited by a metal-organic chemical vapor deposition process.

15. A method for making a VCSEL with integrated photodetector as claimed in claim 14 where, in the step of forming of the conductive layers, the conductive layers are formed by evaporation.

16. A method for making a VCSEL with integrated photodetector as claimed in claim 15 where, in the step of forming the conductive layers, the first and the second conductive layers are achieved by lift off process.

* * * * *